United States Patent [19]

Kobayashi et al.

[11] Patent Number: 5,351,030
[45] Date of Patent: Sep. 27, 1994

[54] VARIABLE ATTENUATOR FOR ATTENUATING GAIN OF ANALOG SIGNAL IN ACCORDANCE WITH DIGITAL SIGNAL

[75] Inventors: Osamu Kobayashi; Kunihiko Gotoh, both of Kawasaki, Japan

[73] Assignee: Fujitsu Limited, Kanagawa, Japan

[21] Appl. No.: 96,993

[22] Filed: Jul. 27, 1993

[30] Foreign Application Priority Data

Oct. 5, 1992 [JP] Japan .................................. 4-265884

[51] Int. Cl.$^5$ .......................... H01C 7/22; H03H 7/25
[52] U.S. Cl. .................................... 338/295; 338/320; 333/81 R
[58] Field of Search ............. 338/295, 320; 333/81 A, 333/81 R

[56] References Cited

U.S. PATENT DOCUMENTS

| | | | |
|---|---|---|---|
| 3,590,366 | 6/1971 | Vaughn | 333/81 R X |
| 3,617,959 | 11/1971 | Brander | 333/81 R |
| 3,735,264 | 5/1973 | Mauduech | 325/38 |
| 3,750,044 | 7/1973 | Stanley | 330/126 |

*Primary Examiner*—Marvin M. Lateef
*Attorney, Agent, or Firm*—Nikaido, Marmelstein, Murray & Oram

[57] ABSTRACT

A variable attenuator has a plurality of attenuation resistor units, a plurality of switching units, and a plurality of impedance compensation resistor units. The attenuation resistor units are connected in series for attenuating an input signal, and the switching units are provided for the attenuation resistor units. One of the switching units are selected in accordance with a digital control signal supplied from an external source. Each of the impedance compensation resistor units is connected in series with the respective switching units to compensate an output impedance to a specific value regardless of the state of the switching units. Therefore, the variable attenuator of the present invention can correctly control the level of an analog signal by a digital signal.

9 Claims, 12 Drawing Sheets

R : 512 PIECES
SW : 256 PIECES

R : 64 PIECES
SW : 32 PIECES

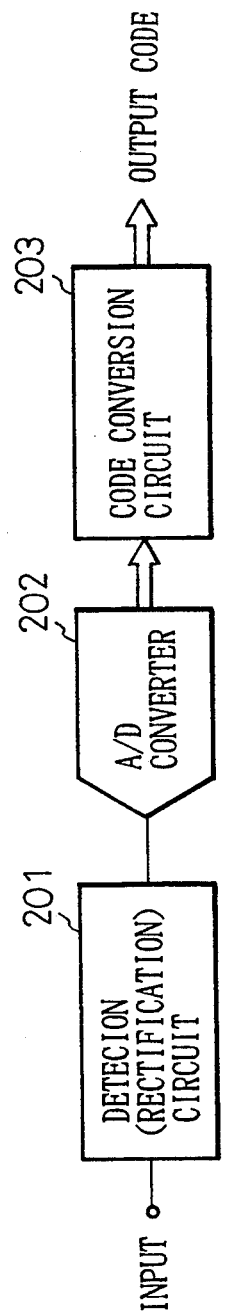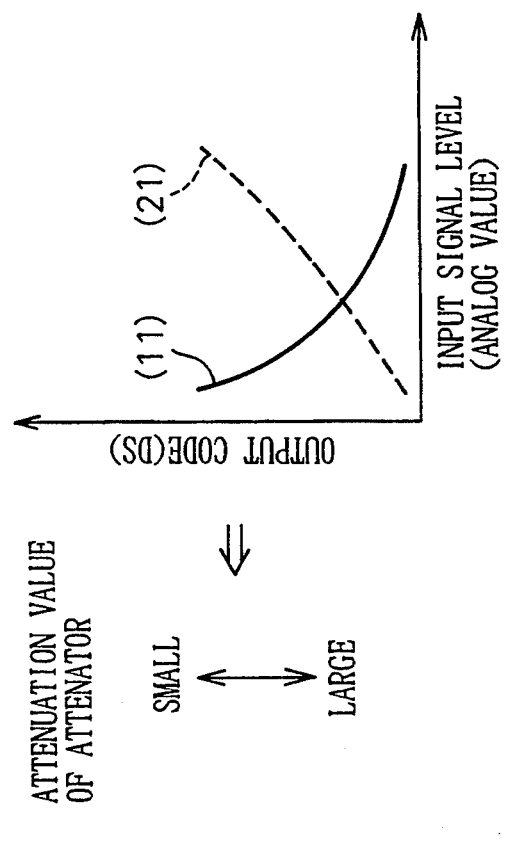

VARIABLE ATTENUATOR FOR ATTENUATING GAIN OF ANALOG SIGNAL IN ACCORDANCE WITH DIGITAL SIGNAL

BACKGROUND OF THE INVENTION

1. Field of the Invention

The present invention relates to a variable attenuator, and more particularly, to a variable attenuator for variously controlling the amplitude (gain) of an analog signal by a digital signal.

2. Description of the Related Art

Recently, it has been required that audio or video devices, or other electronic devices, are able to control the amplitude (level) of an analog signal, e.g., a sound signal, by digital equipment such a microcomputer, remote controller, and the like, without using a hand-operated volume control.

A conventional digitally controlled variable attenuator (variable signal attenuator) digitally controls an analog signal attenuation by switching one of a plurality of switches. In the conventional variable attenuator, the output impedance changes in accordance with the switching state of the switches. Further, when connecting a load resistor having a specific resistance value to the variable attenuator, the attenuation value of each node connected to the switches is independently changed, and thereby the ratios of those attenuation values are also changed and the values of the attenuation resistors must be calculated again.

Further, when applying the variable attenuator to a variable attenuator system having two input signals and using an operational amplifier, a signal output from a first signal source is controlled by the variable attenuation portion and supplied to an inverted input terminal of the operational amplifier, and a signal output from a second signal source is set by level setting resistors and supplied to a normal input terminal of the operational amplifier. When switching the switches so as to obtain an intermediate output voltage by controlling a gain of the first input voltage, there is a problem that a gain defined from a second input voltage to the output voltage is changed. Further, in the conventional variable attenuator, the number of the required attenuation resistors and switches increases in accordance with an increase in the number of bits in the control signal.

SUMMARY OF THE INVENTION

An object of the present invention is to provide a variable attenuator which can correctly control an analog signal by a digital signal. Further, another object of the present invention is to provide a variable attenuator having fewer resistors and switches conventional attenuators.

According to the present invention, there is provided a variable attenuator comprising a plurality of attenuation resistor units connected in series for attenuating an input signal; a plurality of switching units provided for the attenuation resistor units, and an optional one of the switching units being selected in accordance with a digital control signal supplied from an external source; and a plurality of impedance compensation resistor units each connected in series with the respective switching units for compensating the output impedance to a specific value regardless of the state of the plurality of switching units.

A resistance value of one of the plurality of impedance compensation resistor units may be determined to be zero. The variable attenuator may further comprise an operational amplifier, an inverted input terminal of the operational amplifier may be supplied with a first signal source having an attenuation value obtained by the digital control signal, and a normal input of the operational amplifier may be supplied with a second signal source. The output of the second signal source may be attenuated by a specific attenuation value and be supplied to the normal input terminal of the operational amplifier.

According to the present invention, there is also provided a variable attenuator having a plurality of variable attenuation portions, wherein each of the variable attenuation portions comprises a plurality of attenuation resistor units connected in series for attenuating an input signal; a plurality of switching units provided for the attenuation resistor units, and one of the switching units being selected in accordance with a digital control signal supplied from an external source; and a plurality of impedance compensation resistor units each connected in series with the respective switching units for compensating the output impedance to a specific value regardless of the state of the plurality of switching units.

The variable attenuator may comprise a first and second signal attenuation portions, an input terminal of the first signal attenuation portion may be supplied with the input signal, an input terminal of the second signal attenuation portion may be connected to an output terminal of the first signal attenuation portion.

BRIEF DESCRIPTION OF THE DRAWINGS

The present invention will be more clearly understood from the description of the preferred embodiments as set forth below with reference to the accompanying drawings, wherein:

FIG. 12A is a block diagram showing a level detection circuit of the level compressor/expander shown in FIG. 11A; and FIG. 12B is a diagram showing a relationship between the output code and the input signal level.

DESCRIPTION OF THE PREFERRED EMBODIMENTS

For a better understanding of the preferred embodiments, the problems of the related art will be explained, with reference to FIGS. 1 to 4.

Figure 1:
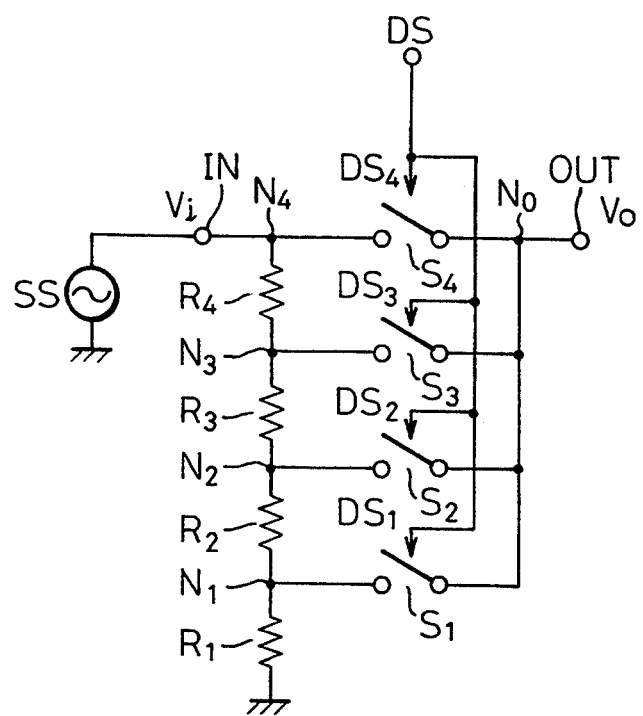
FIG. 1 is a circuit diagram showing an example of a variable attenuator according to the prior art.
Figure 2A:
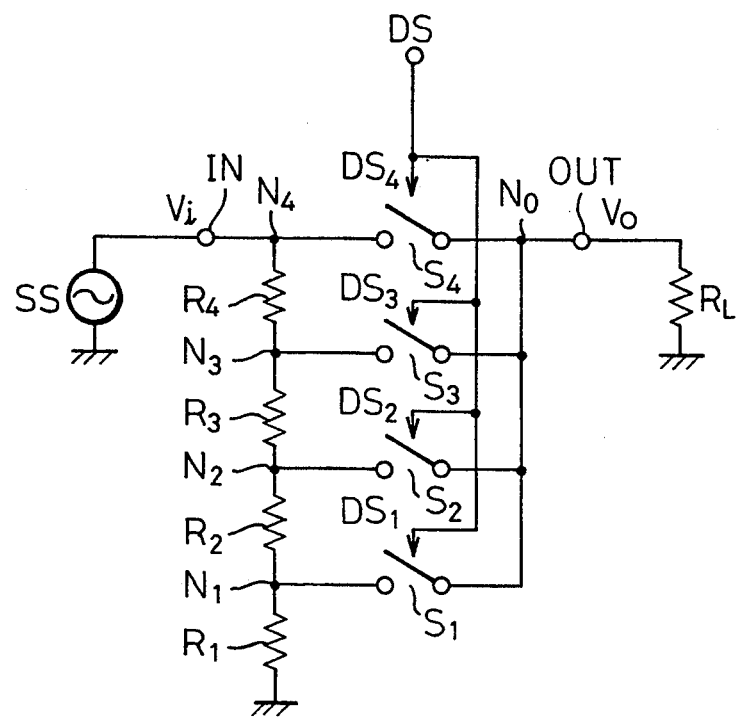
FIG. 2A is a circuit diagram showing the variable attenuator of FIG. 1 where a load is connected.

FIG. 1 shows an example of a variable attenuator according to the prior art, and FIG. 2A shows the variable attenuator of FIG. 1 where a load is connected. In FIGS. 1 and 2A, reference IN denotes an input terminal, OUT denotes an output terminal, SS denotes a signal source, $R_1$, to $R_4$ denote attenuation resistors, $R_L$ denotes a load resistor, and $S_1$ to $S_4$ denote switches.

Figure 2B:
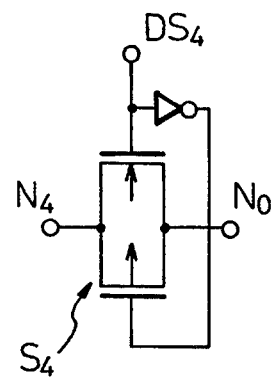
FIG. 2B is a circuit diagram showing an example of a switching unit shown in FIG. 2A.

FIG. 2B shows a concrete configuration of each of the switches $S_1$ to $S_4$. Namely, each of the switches $S_1$ to $S_4$ comprises a transfer gate consisting of P-channel and N-channel type MOS transistors and an inverter, and one of the switches is selected in accordance with a switch selection signal DS ($DS_1$ to $DS_4$). Note, the switch selection signals $DS_1$ to $DS_4$ are, for example, signals obtained by decoding a two bit digital signal (digital control signal).

As shown in FIG. 1, a conventional digitally controlled variable attenuator (variable signal attenuator) digitally controls the attenuation of an analog signal supplied from the signal source SS to the input terminal IN and output to the output terminal OUT (output voltage $V_0$) by switching one of the switches $S_1$ to $S_4$, to select one attenuated signal by the signals appeared at intermediate nodes $N_1$ to $N_4$ of the attenuation resistors $R_1$ to $R_4$.

Nevertheless, in the variable attenuator (attenuation circuit) shown in FIGS. 1 and 2A, an output impedance $Z_0$ defined at the output terminal OUT (node $N_0$) is changed as follows, in accordance with the switching state of the switches $S_1$ to $S_4$.

One of the switches $S_1$ to $S_4$ is switched ON.

When the switch $S_1$ is switched ON:

$$\frac{V_o}{V_i} = \frac{R_1}{R_1 + R_2 + R_3 + R_4} : \text{defined to be } L_1$$

When the switch $S_2$ is switched ON:

$$\frac{V_o}{V_i} = \frac{R_1 + R_2}{R_1 + R_2 + R_3 + R_4} : \text{defined to be } L_2$$

When the switch $S_3$ is switched ON:

$$\frac{V_o}{V_i} = \frac{R_1 + R_2 + R_3}{R_1 + R_2 + R_3 + R_4} : \text{defined to be } L_3$$

When the switch $S_4$ is switched ON:

$$\frac{V_o}{V_i} = 1: \text{defined to be } L_4$$

Therefore, as shown in FIG. 2A, when the load resistor $R_L$, having a specific resistance value, is connected to the variable attenuator, the attenuation value ($V_0/V_i$) of each node ($N_1$ to $N_4$) is independently changed, and thereby the ratios by the attenuation values are also changed and the resistance values of the attenuation resistors $R_1$ to $R_4$ must be calculated again.

Output impedance $Z_0$ is defined at the node $N_0$. When the switch $S_1$ is switched ON:

$$Z_o = \frac{R_1(R_1 + R_2 + R_3 + R_4)}{R_1 + R_2 + R_3 + R_4} : \text{defined to be } Z_1$$

When the switch $S_2$ is switched ON:

$$Z_o = \frac{(R_1 + R_2)(R_3 + R_4)}{R_1 + R_2 + R_3 + R_4} : \text{defined to be } Z_2$$

When the switch $S_3$ is switched ON:

$$Z_o = \frac{(R_1 + R_2 + R_3)R_4}{R_1 + R_2 + R_3 + R_4} : \text{defined to be } Z_3$$

When the switch $S_4$ is switched ON:

$$Z_o = 0: \text{defined to be } Z_4$$

Figure 3:
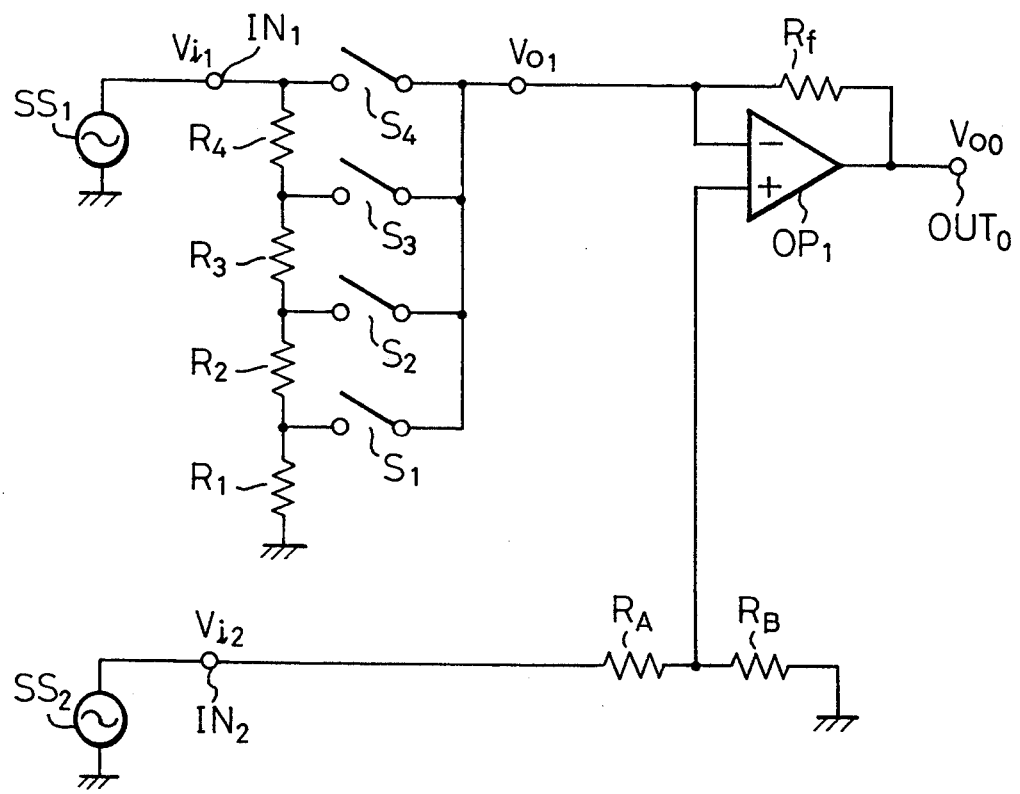
FIG. 3 is a circuit diagram showing another example of a variable attenuator according to the prior art.

FIG. 3 shows another example of a variable attenuator according to the prior art, and shows a variable attenuator having two input signals. In FIG. 3, reference $OP_1$ denotes an operational amplifier, $SS_1$ denotes a first signal source, $SS_2$ denotes a second signal source, $IN_1$ denotes a first input terminal, $IN_2$ denotes a second input terminal, $OUT_0$ denotes an output terminal, and $R_f$ denotes a feedback resistor.

As shown in FIG. 3, when applying two input signals to a variable attenuator circuit shown in FIG. 1 which uses an operational amplifier $OP_1$, the signal from the first signal source $SS_1$ is controlled by the variable attenuator of FIG. 1 and supplied to the inverted input terminal of the operational amplifier $OP_1$, and a signal output from the second signal source $SS_2$ is attenuated by level setting resistors $R_A$, $R_B$ and supplied to the normal input terminal of the operational amplifier $OP_1$.

Nevertheless, as shown in FIG. 3, when the variable attenuator is used in the variable attenuator system using the operational amplifier $OP_1$ and having two input signals, switching the switches $S_1$ to $S_4$ so as to obtain an intermediate output voltage $V_{o0}$ by controlling a gain of the first input voltage $V_1$, causes a problem in that the gain from the second input to the output is changed.

Figure 4:
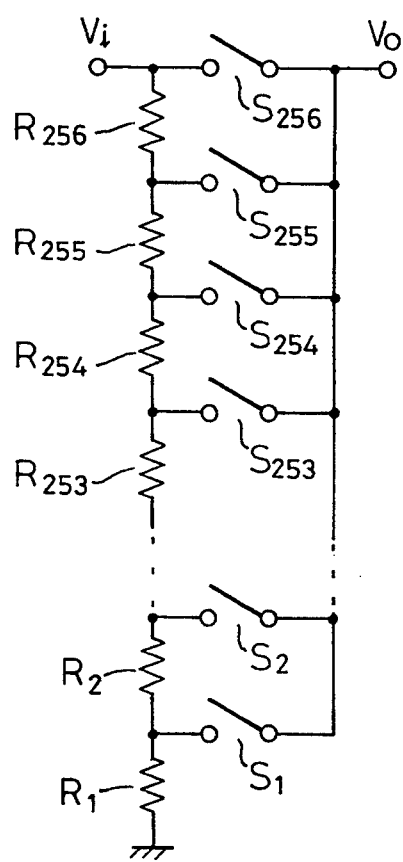
FIG. 4 is a diagram for explaining the number of elements required for the embodiment of the variable attenuator according to the prior art.

FIG. 4 is a diagram for explaining the number of elements required for the embodiment of the variable attenuator according to the prior art when the variable attenuator can produce 256 values of an output voltage $V_o$ by controlling the level of an input voltage $V_i$ in accordance with an 8-bit digital control signal.

As shown in FIG. 4, the conventional 8-bit variable attenuator requires 256 attenuation resistors $R_1$ to $R_{256}$ and switches $S_1$ to $S_{256}$, and thus the number of the required attenuation resistors and switches is increased in accordance with an increase in the number of bits in the control signal.

As described above, in the conventional variable attenuator, when the output impedance is changed, the resistance values of the attenuation resistors in relation to a specific load impedance must be again calculated and changed. Further, there is a problem that the conventional variable attenuator is difficult to use in a negative feedback system using an operational amplifier, and the like. Furthermore, in the conventional variable attenuator, there is a problem that a plurality of attenuation resistors and switches are required, and this problem becomes larger in accordance with an increase in the number of bits in the control signal.

Below, the present invention will be explained with reference to the drawings.

Figure 5:
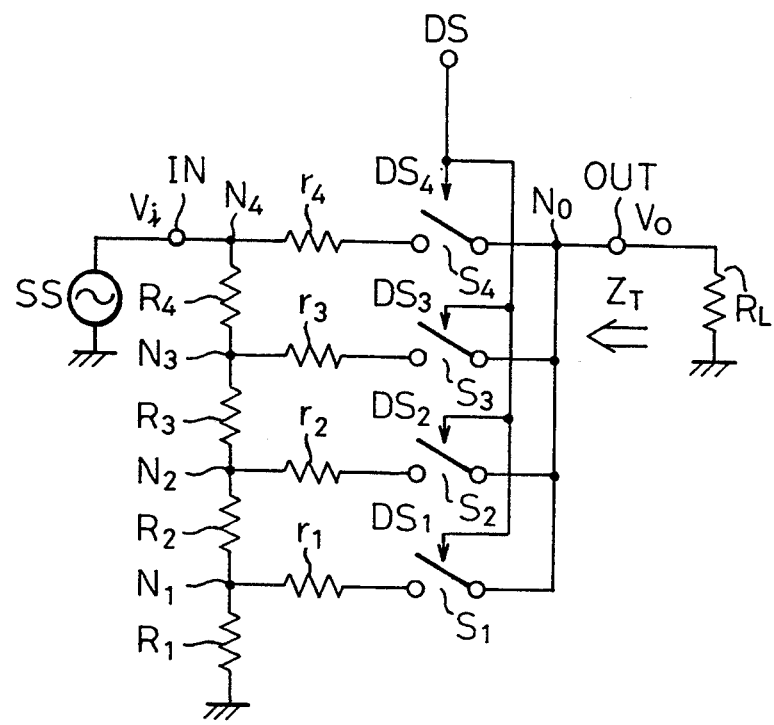
FIG. 5 is a circuit diagram showing a first embodiment of a variable attenuator according to the present invention.

FIG. 5 shows a first embodiment of a variable attenuator according to the present invention. In FIG. 5, reference IN denotes an input terminal, OUT denotes an output terminal, SS denotes a signal source, $R_1$ to $R_4$ denote attenuation resistors, $r_1$ to $r_4$ denote impedance compensation resistors, $R_L$ denotes a load resistor, and $S_1$ to $S_4$ denote switches. Note, in FIG. 5, the attenuation resistors, switches and impedance compensation resistors are provided for four attenuation levels. Nevertheless, in the actual variable attenuators, the number of each of the attenuation resistors, switches and impedance compensation resistors is, for example, determined to be 256 or 1024, and one switch is selected by a switch selection signal which is obtained by decoding an 8-bit or 10-bit digital control signal, so that the required attenuation value is obtained.

Each of the switches $S_1$ to $S_4$ has the configuration shown in FIG. 2B. Namely, each of the switches $S_1$ to $S_4$ comprises a transfer gate consisting of a P-channel and N-channel type MOS transistors and an inverter, and one of the switches is selected in accordance with a switch selection signal DS ($DS_1$ to $DS_4$). Note, the switch selection signals $DS_1$ to $DS_4$ are, for example, signals obtained by decoding a two bit digital signal.

As shown in FIG. 5, a digitally controlled variable attenuator (variable signal attenuator) of the first embodiment controls the attenuation of an analog signal supplied from the signal source SS to the input terminal IN and output to the output terminal OUT (output voltage $V_0$) by switching one of the switches $S_1$ to $S_4$, to select one attenuated signal from the signals appeared at intermediate nodes $N_1$ to $N_4$ of the attenuation resistors $R_1$ to $R_4$.

Note, the attenuation values (attenuation factors), which are indicated by the following equations, are determined by the switching state of the switches $S_1$ to $S_4$ in accordance with the switch selection signal DS ($DS_1$ to $DS_4$).

When the switch $S_1$ is switched ON:

$$\frac{V_o}{V_i} = L_1 \times \frac{R_L}{Z_1 + R_L}$$

When the switch $S_2$ is switched ON:

$$\frac{V_o}{V_i} = L_2 \times \frac{R_L}{Z_2 + R_L}$$

When the switch $S_3$ is switched ON:

$$\frac{V_o}{V_i} = L_3 \times \frac{R_L}{Z_3 + R_L}$$

When the switch $S_4$ is switched ON:

$$\frac{V_o}{V_i} = L_4 \times \frac{R_L}{Z_4 + R_L}$$

Where, references $L_1$, $L_2$, $L_3$, and $L_4$ are defined by the following equations.

$$L_1 = \frac{R_1}{R_1 + R_2 + R_3 + R_4}$$

$$L_2 = \frac{R_1 + R_2}{R_1 + R_2 + R_3 + R_4}$$

$$L_3 = \frac{R_1 + R_2 + R_3}{R_1 + R_2 + R_3 + R_4}$$

$$L_4 = 1$$

Therefore, the attenuation factors are indicated by the following equations. Note, in the following equations, the impedance compensation resistors $r_1$ to $r_4$ are used to absorb the differences among the impedances $Z_1$ to $Z_4$ at the nodes $N_1$ to $N_4$, and each value of the impedance compensation resistors $r_1$ to $r_4$ is indicated by $r_i = Z_T - Z_i$. Consequently, the output impedance determined from the node $N_o$ (output terminal OUT) is maintained at a constant value $Z_T$ regardless the selected switching state of the switches $S_1$ to $S_4$.

When the switch $S_1$ is switched ON:

$$\frac{V_o}{V_i} = \frac{R_4}{R_1 + R_2 + R_3 + R_4} \cdot \frac{R_L}{Z_T + R_L}$$

When the switch $S_2$ is switched ON:

$$\frac{V_o}{V_i} = \frac{R_1 + R_2}{R_1 + R_2 + R_3 + R_4} \cdot \frac{R_L}{Z_T + R_L}$$

When the switch $S_3$ is switched ON:

$$\frac{V_o}{V_i} = \frac{R_1 + R_2 + R_3}{R_1 + R_2 + R_3 + R_4} \cdot \frac{R_L}{Z_T + R_L}$$

When the switch $S_4$ is switched ON:

$$\frac{V_o}{V_i} = \frac{R_L}{Z_T + R_L}$$

$r_4 = Z_T$
$r_3 = Z_T - (R_4 // (R_3 + R_2 + R_1))$
$r_2 = Z_T - ((R_4 + R_3) // (R_2 + R_1))$
$r_1 = Z_T - ((R_4 + R_3 + R_2) // R_1)$

As described above, in accordance with the variable attenuator of the first embodiment of the present invention, the output impedance determined from the output terminal OUT is maintained at the constant value $Z_T$ regardless the selected switching state of the switches $S_1$ to $S_4$. Therefore, when connecting the load resistor $R_L$ to the output terminal OUT of the variable attenuator, the attenuation value (attenuation factor: $V_o/V_i$) of each of taps (nodes) can be determined in accordance with the required value (designed value), so that the gain of the analog signal can be correctly controlled by the digital signal.

Figure 6:
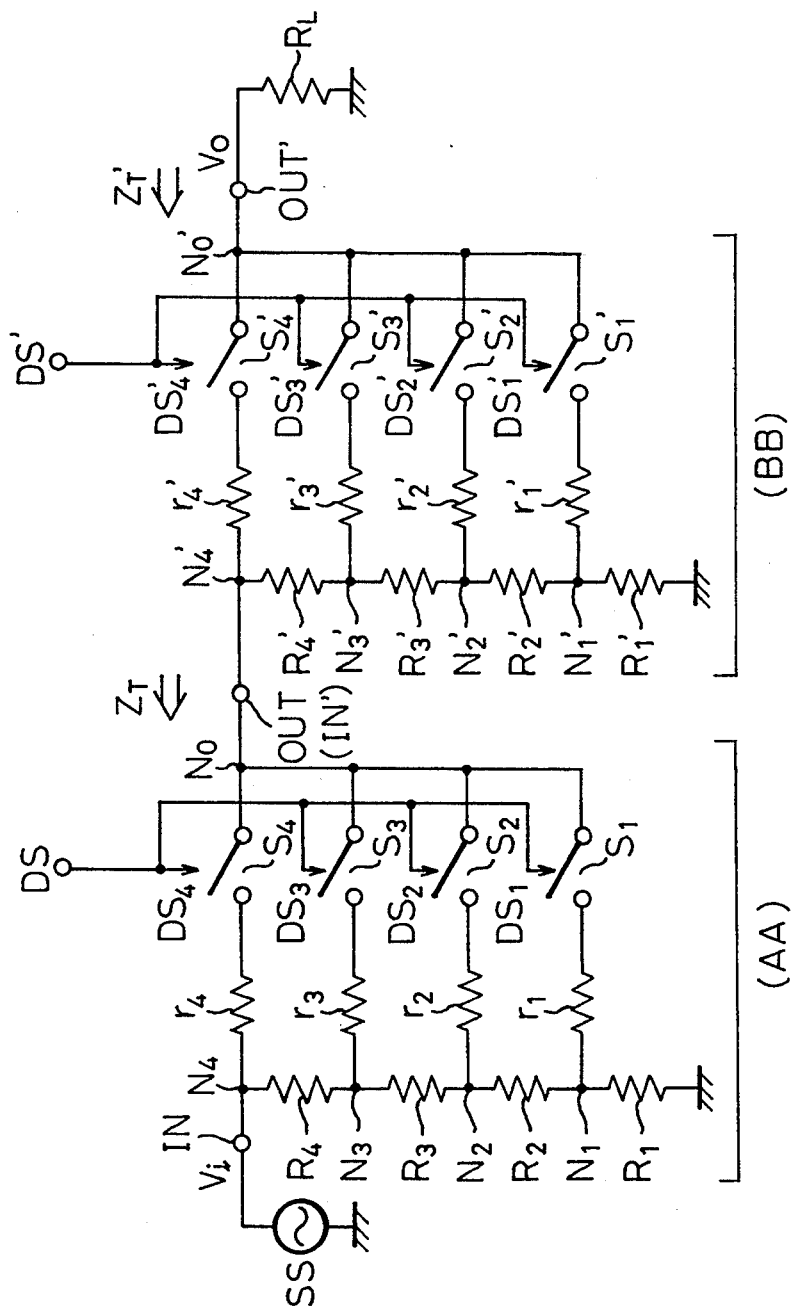
FIG. 6 is a circuit diagram showing a second embodiment of a variable attenuator according to the present invention.

FIG. 6 shows a second embodiment of a variable attenuator according to the present invention.

As shown in FIG. 6, the variable attenuator of the second embodiment has a first variable attenuation portion AA and a second variable attenuation portion BB, and an input terminal (IN') of the second variable attenuation portion BB is connected to an output terminal (OUT) of the first variable attenuation portion AA. The first variable attenuation portion AA comprises a plurality of attenuation resistors $R_1$ to $R_4$, a plurality of switches $S_1$ to $S_4$, and a plurality of impedance compensation resistors $r_1$ to $r_4$. Similarly, the second variable attenuation portion BB comprises a plurality of attenuation resistors $R_4'$ to $R_4'$, a plurality of switches $S_1'$, to $S_4'$, and a plurality of impedance compensation resistors $r_1'$ to $r_4'$.

In the variable attenuator of the first embodiment shown in FIG. 5, the output impedance is maintained at the constant value $Z_T$ regardless the attenuation values (attenuation factors), and thus a plurality of stages of the variable attenuators (variable attenuation portions) can be connected without re-designing (changing) the attenuation resistors, as shown in FIG. 6. In FIG. 6, the variable attenuator is constituted by two variable attenuation portions AA and BB, but the number of the stages of the variable attenuation portions is not limited to two.

Note, the values of $L_1$ to $L_4$, $L_1'$ $L_4'$, $r_1$ to $r_4$, and $r_1'$ to $r_4'$ are determined by the following equations.

$$L_1 = \frac{R_1}{R_1 + R_2 + R_3 + R_4}$$

$$L_2 = \frac{R_1 + R_2}{R_1 + R_2 + R_3 + R_4}$$

$$L_3 = \frac{R_1 + R_2 + R_3}{R_1 + R_2 + R_3 + R_4}$$

$$L_4 = 1$$

$$L_1' = \frac{R_1'}{R_1' + R_2' + R_3' + R_4' + Z_T}$$

$$L_2' = \frac{R_1' + R_2'}{R_1' + R_2' + R_3' + R_4' + Z_T}$$

$$L_3' = \frac{R_1' + R_2' + R_3'}{R_1' + R_2' + R_3' + R_4' + Z_T}$$

$$L_4' = \frac{R_1' + R_2' + R_3' + R_4'}{R_1' + R_2' + R_3' + R_4' + Z_T}$$

$r_1 = Z_T - (R_1//(R_2 + R_3 + R_4))$
$r_2 = Z_T - ((R_1 + R_2)//(R_3 + R_4))$
$r_3 = Z_T - ((R_1 + R_2 + R_3)//R_4)$
$r_4 = Z_T$
$r_1' = Z_{T'} - (R_1'//(R_2' + R_3' + R_4' + Z_T))$
$r_2' = Z_{T'} - ((R_1' + R_2')//(R_3' + R_4' + Z_T))$
$r_3' = Z_{T'} - ((R_1' + R_2' + R_3')//(R_4' + Z_T))$
$r_4' = Z_{T'} - ((R_1' + R_2' + R_3' + R_4')//Z_T)$ $$\frac{V_o}{V_i} = L_i \times L_j \times \frac{R_L}{Z_{T'} + R_L}$$

In the second embodiment shown in FIG. 6, one of the switches $S_1$ to $S_4$ of the first variable attenuation portion AA is selected by a switch selection signal DS ($DS_1$ to $DS_4$), and similarly, one of the switches $S_1'$ to $S_4'$ of the second variable attenuation portion BB is selected by a switch selection signal DS' ($DS_1'$ to $DS_4'$). Note, the attenuation value of the variable attenuator of the second embodiment is determined by combining the attenuation values of the first and second variable attenuation portions AA and BB.

As described above, in the variable attenuator of the second embodiment shown in FIG. 6, the output impedance determined from the node $N_0$ (output terminal OUT of the first variable attenuation portion AA) is maintained at a constant value $Z_T$ regardless the selected state of the switches $S_1$ to $S_4$, and similarly, the output impedance determined from the node $N_0'$ (output terminal OUT' of the second variable attenuation portion BB) is maintained at a constant value $Z_{T'}$ regardless the selected switching state of the switches $S_1'$ to $S_4'$. Therefore, a plurality of stages of variable attenuation portions (for example, two stages AA and BB) can be connected.

Figure 7A:
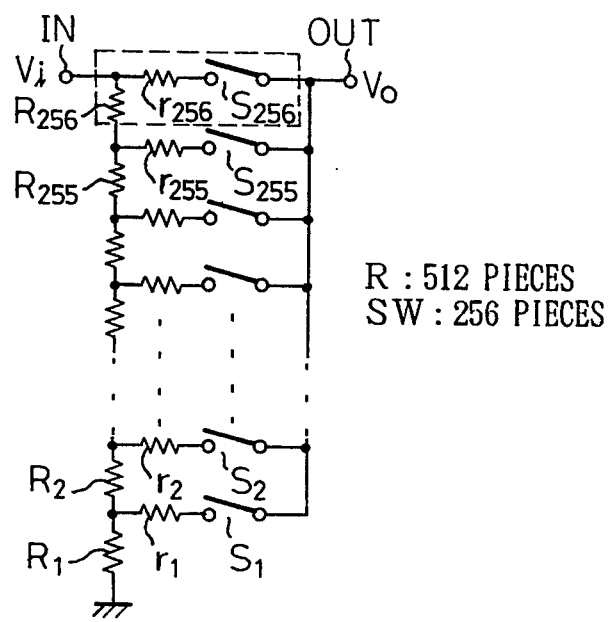
FIG. 7A is a diagram for explaining the number of elements required for the embodiment of the variable attenuator of FIG. 5.
Figure 7B:
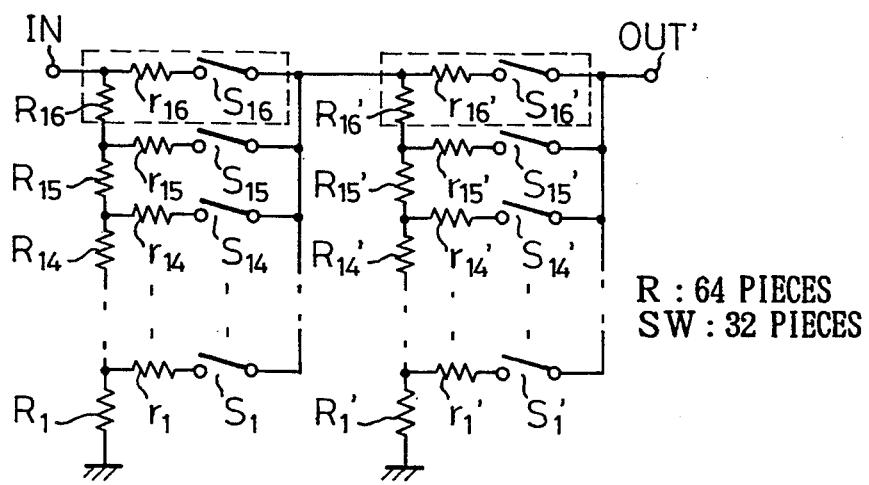
FIG. 7B is a diagram for explaining the number of elements required for the embodiment of the variable attenuator of FIG. 6.

FIGS. 7A and 7B are diagrams for explaining the number of elements required for the embodiments of the variable attenuators of FIGS. 5 and 6, and FIGS. 7A and 7B show variable attenuators which can attenuate an input voltage $V_i$ in 256 steps (levels). Note, FIG. 7A shows the variable attenuator constituted by applying the first embodiment shown in FIG. 5, and FIG. 7B shows the variable attenuator constituted by applying the second embodiment shown in FIG. 6.

First, as shown in FIG. 7A, in the variable attenuator using the first embodiment shown in FIG. 5, the number of the attenuation resistors ($R_1$ to $R_{256}$), the switches ($S_1$ to $S_{256}$), and the impedance compensation resistors ($r_1$ to $r_{256}$) is determined to be 256 each. Namely, as shown in FIG. 7A, in the variable attenuator able to produce 256 levels of the input voltage $V_i$ applying the first embodiment of the present invention (shown in FIG. 5), 512 pieces of resistors (attenuation resistors $R_1$ to $R_{256}$ and impedance compensation resistors $r_1$ to $r_{256}$), and 256 pieces of switches ($S_1$ to $S_{256}$) are required.

On the other hand, as shown in FIG. 7B, in the variable attenuator using the second embodiment shown in FIG. 6, the number of each of the attenuation resistors ($R_1$ to $R_{16}$, $R_1'$ $R_{16}'$), the switches ($S_1$ to $S_{16}$, $S_1'$ to $S_{16}'$), and the impedance compensation resistors ($r_1$ to $r_{16}$, $r_1'$ to $r_{16}'$) is determined to be 32, respectively. Namely, as shown in FIG. 7B, in the variable attenuator able to produce 256 levels of the input voltage $V_i$ using the second embodiment of the present invention (shown in FIG. 6), 64 pieces of resistors (attenuation resistors $R_1$ to $R_{16}$, $R_1'$ to $R_{16}'$ and impedance compensation resistors $r_1$ to $r_{16}$, $r_1'$ to $r_{16}'$), and 32 pieces of switches ($S_1$ to $S_{16}$, $S_1'$ to $S_{16}'$) are required.

As described above, in the variable attenuator of the second embodiment according to the present invention shown in FIG. 6, the numbers of resistors (attenuation resistors and impedance compensation resistors) and switches can be greatly reduced. Note, this effect of reducing the number of the resistors and switches becomes very large the number of the variable attenuation portions, or the resolution of the attenuation value is increased. As described above, in the present invention, the number of the variable attenuation portions is not limited to two, but it can be variously determined.

Figure 8:
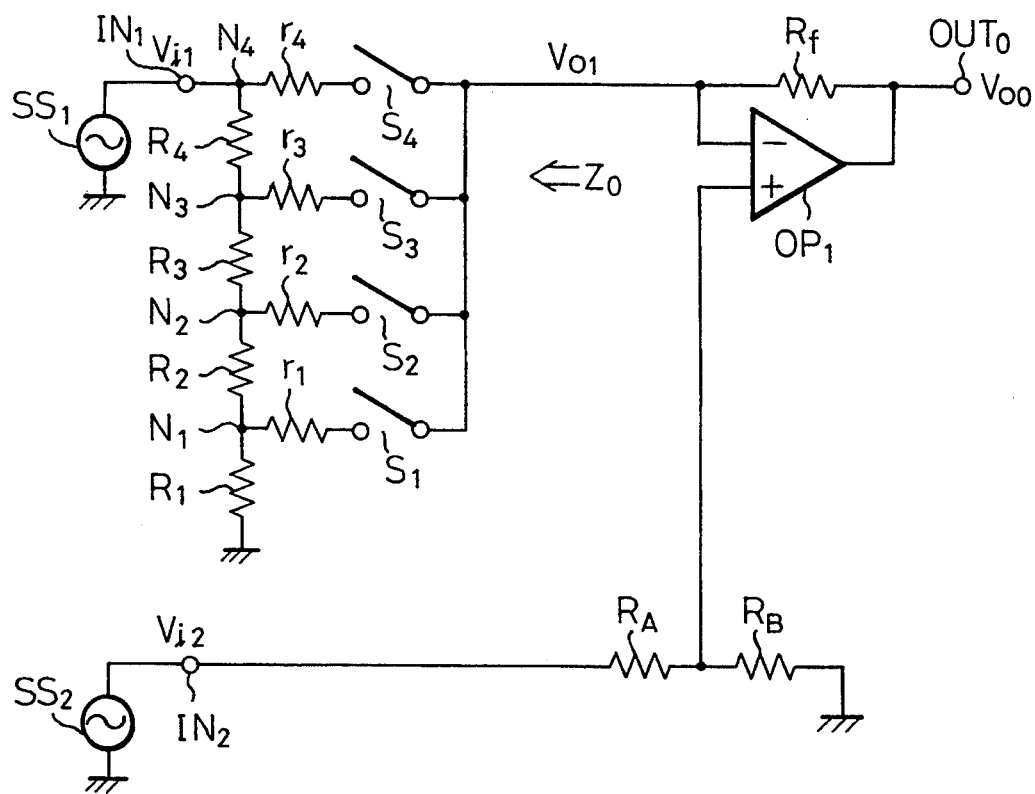
FIG. 8 is a circuit diagram showing a third embodiment of a variable attenuator according to the present invention.

FIG. 8 shows a third embodiment of a variable attenuator according to the present invention, and shows a variable attenuator having two input signals. In FIG. 8, reference $OP_1$ denotes an operational amplifier, $SS_1$ denotes a first signal source, $SS_2$ denotes a second signal source, $IN_1$ denotes a first input terminal, $IN_2$ denotes a second input terminal, $OUT_0$ denotes an output terminal, and Rf denotes a feedback resistor.

As shown in FIG. 8, when applying the variable attenuator of FIG. 5 to a variable attenuator having two input signals and using the operational amplifier $OP_1$, a signal output from the first signal source $SS_1$ is controlled by the variable attenuator of FIG. 5 and supplied to an inverted input terminal of the operational amplifier $OP_1$, and a signal from the second signal source $SS_2$ is set by level setting resistors $R_A$, $R_B$ and supplied to a normal input terminal of the operational amplifier $OP_1$.

In the third embodiment of the variable attenuator according to the present invention, the output impedance of the variable attenuator, which is used to attenuate the level of the first signal source $SS_1$, is maintained at a constant value regardless the selected switching state of the switches $S_1$ to $S_4$, and thus the level compared to a second input signal $V_{i2}$ output from the second signal source $SS_2$ is not changed, when changing the attenuation value of a first input signal $V_{i1}$ output from the second signal source $SS_1$ by changing the switching state of the switches $S_1$ to $S_4$. Therefore, the first signal source $SS_1$ having the required (designed) attenuation value can be added to the second input signal $V_{i2}$ set by level setting resistors $R_A$ and $R_B$.

Figure 9A:
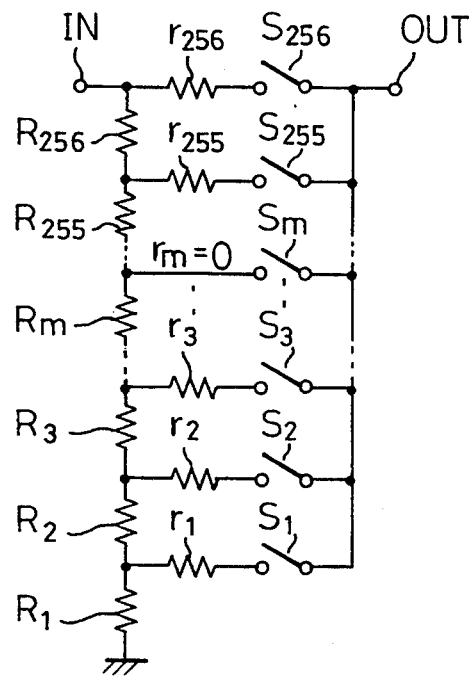
FIGS. 9A and 9B are circuit diagrams showing modifications of the embodiments of the variable attenuator according to the present invention.
Figure 9B:
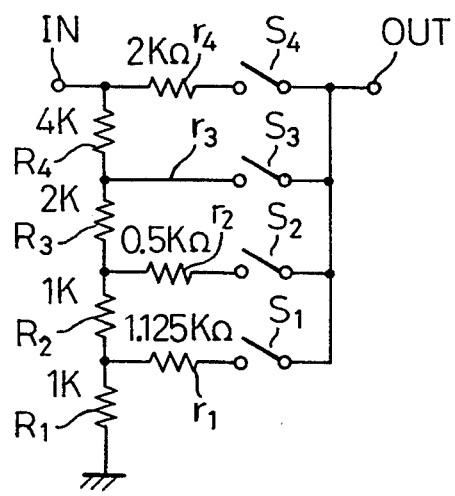

FIGS. 9A and 9B show modifications to the embodiments of the variable attenuator according to the present invention.

In the above first, second, and third embodiments of the variable attenuator, one of the impedance compensation resistors can be determined to be $0\Omega$, or one impedance compensation resistor having the least resistance value can be omitted. Concretely, as shown in FIG. 9A, the impedance compensation resistor $r_m$ can be constituted by a conductive wiring to reduce the value of the impedance compensation resistor $r_m$ to $0\Omega$. Similarly, as shown in FIG. 9B, where the objective output impedance is determined to be 2 k$\Omega$, the impedance compensation resistor $r_3$ can be constituted by a conductive wiring to reduce the value of the impedance compensation resistor $r_3$ to $0\Omega$. Note, when one impedance compensation resistor ($r_m$, $r_3$) having the least resistance value is constituted by the conductive wiring (or omitted), the signal loss caused by inserting the variable attenuator can be minimized.

Figure 10:
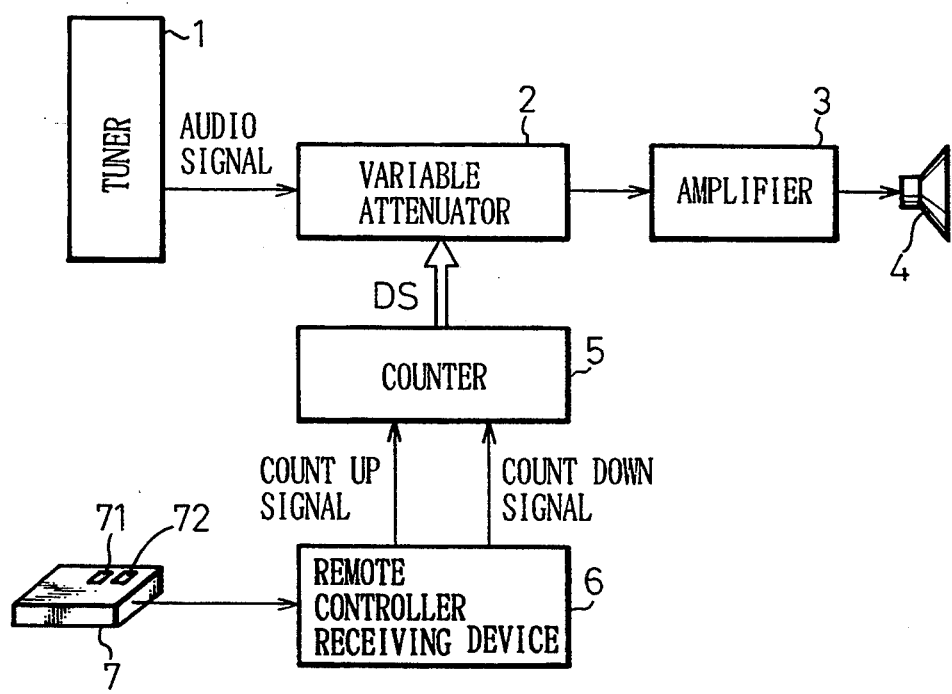
FIG. 10 is a block diagram showing a volume control portion as an example of applying the variable attenuator according to the present invention.

FIG. 10 shows a volume control portion as an example of applying the variable attenuator according to the present invention. In FIG. 10, reference numeral 1 denotes a tuner (signal source), 2 denotes a variable attenuator (variable attenuation portion), 3 denotes an amplifier, 4 denotes a speaker, 5 denotes a counter, 6 denotes a remote controller receiving device, and 7 denotes a remote controller.

As shown in FIG. 10, the variable attenuator of the present invention is, for example, used to control the sound volume of a television set, and the like. The remote controller 7 has a volume increasing button 71 and a volume decreasing button 72, and a count up signal and a count down signal are output from the remote controller receiving device 6 to the counter 5 in accordance with the operation of the buttons 71 and 72 in the remote controller 7. Then, the counter 5 outputs a digital control signal (switch selection signal) DS to the variable attenuator 2, and the specific switch corresponding to the switch selection signal DS is selected, so that a required attenuation value can be obtained.

Namely, an audio signal output from the tuner 1 is attenuated by the variable attenuator 2 in accordance with the operation of the buttons 71 and 72 in the remote controller 7 and supplied to the amplifier 3, and thereby the sound volume output from the speaker 4 is controlled. Note, the digital control signal DS having n-bits (for example, 8-bits) output from the counter 5 is, for example, decoded by a decoder provided at the variable attenuator 2, and a switch selection signal (DS) is supplied to the switches ($S_1$ to $S_{256}$) to select (or switch ON) one switch.

Figure 11A:
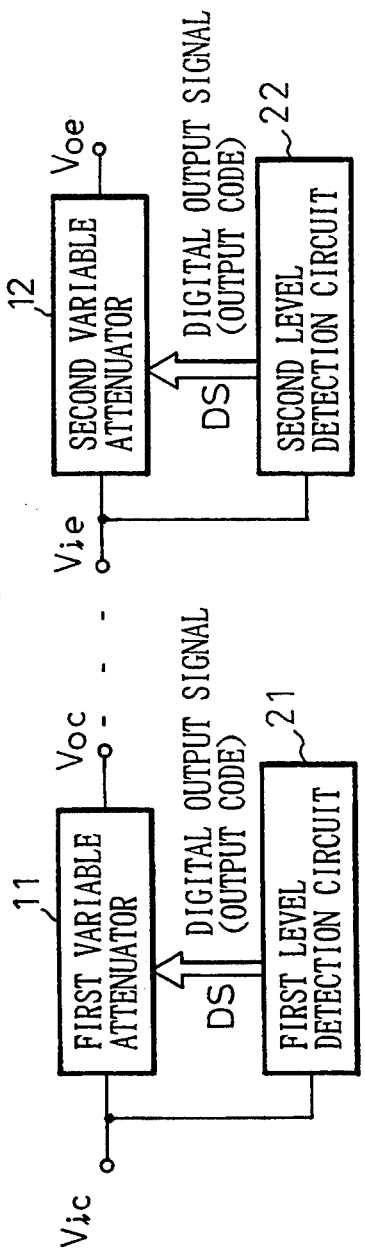
FIG. 11A is a block diagram showing a level compressor/expander of an audio signal as another example of applying the variable attenuator according to the present invention.
Figure 11B:
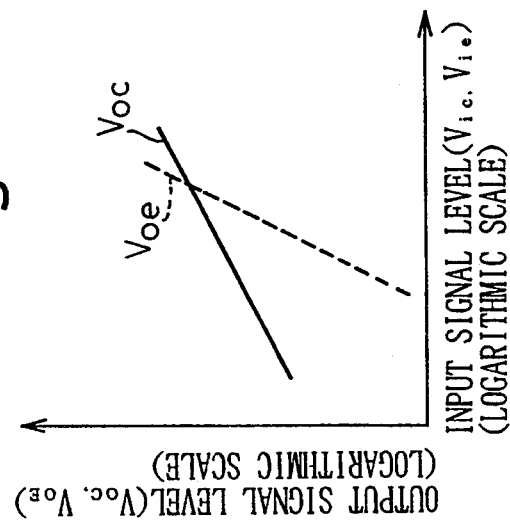
FIG. 11B is a diagram showing a relationship between the output signal level and the input signal level of the level compressor/expander shown in FIG. 11A.

FIG. 11A shows a level compressor/expander for an audio signal as another example of applying the variable attenuator according to the present invention, and FIG. 11B shows a relationship between the output signal level and the input signal level of the level compressor/expander shown in FIG. 11A.

In FIG. 11A, reference numerals 11 and 12 denote first and second variable attenuators (variable attenuators), and 21 and 22 denote first and second level detection circuits. Note, the connection between the signal compressor portion having the first variable attenuator 11 and level detection circuit 21 and the signal expander portion having the second variable attenuator 12 and level detection circuit 22 is constituted by communication means such as a telephone line, memory means such as a magnetic tape, and the like; and the signal compressed by the signal compressor portion is expanded and reconstructed by the signal expander portion.

In FIG. 11A, the first variable attenuator 11 and the first level detection circuit 21 are used to compress an audio signal level, and the second variable attenuator 12 and the second level detection circuit 22 are used to expand the expressed audio signal level. Note, the relationship between the output signal level Voc and the input signal level Vic of the signal compressor portion, which is shown by a solid-line in FIG. 11B, is determined to be a gradually sloped line, and the relationship between the output signal level Voe and the input signal level Vie of the signal expander portion, which is shown by a dot-line in FIG. 11B, is determined to be a steeply sloped line.

FIG. 12A shows a level detection circuit (21, 22) of the level compressor/expander shown in FIG. 11A, and FIG. 12B shows a relationship between the output code and the input signal level. In FIG. 12A, reference numeral 201 denotes a detection (rectification) circuit, 202 denotes an analog to digital (A/D) converter, and 203 denotes a code conversion circuit.

In the signal compressor portion (first level detection circuit 21), the input signal (audio signal) Vic is supplied to the detection circuit 201 and is converted into a digital signal by the A/D converter 202. Further, the output signal of the A/D converter 202 is converted into an output code (digital control signal, or switch selection signal) DS by the code conversion circuit 203, and the switch selection signal DS is supplied to the first variable attenuator 11. Similarly, in the signal expander portion (second level detection circuit 22), the compressed input signal Vie is supplied to the detection circuit 201 and is converted into a digital signal by the A/D converter 202. Further, the output signal of the A/D converter 202 is converted into an output code (digital control signal, or switch selection signal) DS by the code conversion circuit 203, and the switch selection signal DS is supplied to the second variable attenuator 21.

Note, the relationship between the output code output from the code conversion circuit 203 (first level detection circuit 21) and the input signal Vic of the signal compressor portion (first level detection circuit 21), which is shown by a solid-line in FIG. 12B, is changed so as to increase the attenuation value of the first variable attenuator 11 in accordance with increasing the level of the input signal (analog audio signal) Vic.

On the other hand, the relationship between the output code output from the code conversion circuit 203 (second level detection circuit 22) and the input signal Vie of the signal expander portion (second level detection circuit 22), which is shown by a dashed-line in FIG. 12B, is changed so as to decrease the attenuation value of the second variable attenuator 12 in accordance with increasing the level of the input signal (analog audio signal) Vie. Namely, the attenuation value of the second variable attenuator 12 is controlled by the output code from the code conversion circuit 203 of the signal expander portion and is in inverse proportion to the attenuation value of the first variable attenuator 11 controlled by the output code from the code conversion circuit 203 of the signal compressor portion.

Thus, the variable attenuator of the present invention can not only be applied to an audio/visual apparatus (A/V device) such a television set, radio-cassette tape recorder, and video tape recorder, but also can be applied to various electronic devices such a level compressor/expander, where the attenuation value is controlled by a digital control signal (DS).

As described above, according to the present invention, there is provided a variable attenuator able to correctly control the level of an analog signal by a digital signal. Further, according to the present invention, there is also provided a variable attenuator having fewer resistors and switches than the conventional one.

Many different embodiments of the present invention may be constructed without departing from the spirit and scope of the present invention, and it should be understood that the present invention is not limited to the specific embodiments described in this specification, except as defined in the appended claims.

We claim:

1. A variable attenuator comprising:
   a plurality of attenuation resistor means, connected in series, for attenuating an input signal;
   a plurality of switching means provided for said attenuation resistor means, and an optional one of said switching means being selected in accordance with a digital control signal supplied from an external source; and
   a plurality of impedance compensation resistor means each connected in series with said respective switching means for compensating an output impedance to a specific value regardless of a state of said plurality of switching means.

2. A variable attenuator as claimed in claim 1, wherein a resistance value of one of said plurality of impedance compensation resistor means is determined to be zero.

3. A variable attenuator as claimed in claim 1, wherein said variable attenuator further comprises an operational amplifier, an inverted input terminal of said operational amplifier is supplied with a first signal source having an attenuation value obtained by said digital control signal, and a normal input of said operational amplifier is supplied with a second signal source 4. A variable attenuator as claimed in claim 3, wherein the output of said second signal source is attenuated by a specific attenuation value and is supplied to the normal input terminal of said operational amplifier.

5. A variable attenuator having a plurality of variable attenuation portions, wherein each of said variable attenuation portions comprises:
   a plurality of attenuation resistor means, connected in series, for attenuating an input signal;
   a plurality of switching means provided for said attenuation resistor means, and one of said switching means being selected in accordance with a digital control signal supplied from an external source; and
   a plurality of impedance compensation resistor means each connected in series with said respective switching means for compensating an output impedance to a specific value regardless of a state of said plurality of switching means.

6. A variable attenuator as claimed in claim 5, wherein said variable attenuator comprises a first and second signal attenuation portions, an input terminal of said first signal attenuation portion is supplied with input signal, an input terminal of said second signal attenuation portion is connected to an output terminal of said first signal attenuation portion.

7. A variable attenuator as claimed in claim 5, wherein a resistance value of one of said plurality of impedance compensation resistor means is determined to be zero.

8. A variable attenuator as claimed in claim 5, wherein said variable attenuator further comprises an operational amplifier, an inversion input terminal of said operational amplifier is supplied with an output of a first signal source having an attenuation value obtained by said digital control signal, and a normal input of said operational amplifier is supplied with an output of a second signal source.

9. A variable attenuator as claimed in claim 8, wherein the output of said second signal source is attenuated by a specific attenuation value and is supplied to the normal input terminal of said operational amplifier.

* * * * *